(12) United States Patent
Kawashima et al.

(10) Patent No.: US 12,308,816 B2
(45) Date of Patent: May 20, 2025

(54) COMMON MODE NOISE FILTER

(71) Applicant: Panasonic Intellectual Property Management Co., Ltd., Osaka (JP)

(72) Inventors: Takuji Kawashima, Fukui (JP); Nariaki Ishida, Fukui (JP); Hideki Tanaka, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1001 days.

(21) Appl. No.: 17/040,362

(22) PCT Filed: Mar. 11, 2019

(86) PCT No.: PCT/JP2019/009775
§ 371 (c)(1),
(2) Date: Sep. 22, 2020

(87) PCT Pub. No.: WO2019/188215
PCT Pub. Date: Oct. 3, 2019

(65) Prior Publication Data
US 2021/0028752 A1 Jan. 28, 2021

(30) Foreign Application Priority Data

Mar. 28, 2018 (JP) .............................. 2018-061166

(51) Int. Cl.
*H01F 17/00* (2006.01)
*H03H 1/00* (2006.01)
*H03H 7/42* (2006.01)

(52) U.S. Cl.
CPC ......... *H03H 7/427* (2013.01); *H01F 17/0013* (2013.01); *H03H 1/0007* (2013.01);
(Continued)

(58) Field of Classification Search
CPC ................ H03H 7/427; H03H 1/0007; H03H 2001/0035; H03H 2001/0057;
(Continued)

(56) References Cited

U.S. PATENT DOCUMENTS

| 6,628,189 B2 * | 9/2003 | Yazaki ...................... H03H 7/42 336/200 |
| 2010/0301966 A1 * | 12/2010 | Yoshino ................... H03H 7/09 336/200 |

(Continued)

FOREIGN PATENT DOCUMENTS

| CN | 106169697 A | 11/2016 |
| CN | 106877835 A | 6/2017 |

(Continued)

OTHER PUBLICATIONS

International Search Report of PCT application No. PCT/JP2019/009775 dated May 28, 2019.

(Continued)

*Primary Examiner* — Mang Tin Bik Lian
(74) *Attorney, Agent, or Firm* — Rimon P.C.

(57) ABSTRACT

The present disclosure provides a common mode noise filter that can improve attenuation characteristics of common mode noise over a wide frequency range. The common mode noise filter of the present disclosure includes: two magnetic sections and each of which is made of a magnetic material; and non-magnetic section disposed between magnetic sections in a stacking direction, non-magnetic section being made of a non-magnetic material. Moreover, the common mode noise filter further includes two coils and metal layer. Coils are disposed inside non-magnetic section while facing each other. Metal layer is formed inside at least one of two magnetic sections while being connected to the ground. Metal layers are positioned closer to a lower surface of magnetic section than an upper surface of magnetic (Continued)

section and closer to an upper surface of magnetic section than a lower surface of magnetic section.

8 Claims, 3 Drawing Sheets

(52) U.S. Cl.
CPC ............ *H01F 2017/0073* (2013.01); *H03H 2001/0035* (2013.01)

(58) Field of Classification Search
CPC .... H03H 2001/0085; H03H 2001/0092; H01F 17/0013; H01F 2017/0073; H01F 17/045; H01F 27/292; H01F 2017/0066; H01F 2017/0093
See application file for complete search history.

(56) References Cited

U.S. PATENT DOCUMENTS

| | | | |
|---|---|---|---|
| 2011/0007438 A1* | 1/2011 | Ito | H03H 7/427 29/829 |
| 2012/0133472 A1* | 5/2012 | Nishikawa | H01F 17/04 336/200 |
| 2013/0234820 A1* | 9/2013 | Yoo | H01F 17/0013 336/200 |
| 2015/0302980 A1* | 10/2015 | Noma | H01F 27/40 336/200 |
| 2016/0163446 A1* | 6/2016 | Park | H05K 9/0067 336/200 |
| 2016/0247623 A1* | 8/2016 | Marusawa | H01F 17/04 |
| 2016/0344181 A1* | 11/2016 | Matsunaga | H01G 4/005 |
| 2017/0092413 A1* | 3/2017 | Matsunaga | H01F 27/2804 |
| 2017/0092414 A1* | 3/2017 | Ishikawa | H01F 27/2804 |
| 2017/0294257 A1* | 10/2017 | Omori | H01F 17/0013 |
| 2018/0047491 A1* | 2/2018 | Katsuta | H01F 27/292 |
| 2018/0286558 A1* | 10/2018 | Yokoyama | H01F 27/2804 |
| 2019/0080839 A1 | 3/2019 | Annen | |

FOREIGN PATENT DOCUMENTS

| | | |
|---|---|---|
| JP | 2003-318687 | 11/2003 |
| JP | 2012-248917 | 12/2012 |
| JP | 2016-219606 | 12/2016 |

OTHER PUBLICATIONS

English Translation of Chinese Office Action dated Dec. 21, 2023 for the related Chinese Patent Application No. 201980019387.6.
English Translation of Chinese Office Action dated Apr. 29, 2024 for the related Chinese Patent Application No. 201980019387.6.

* cited by examiner

COMMON MODE NOISE FILTER

FIELD OF THE INVENTION

The present disclosure relates to a common mode noise filter for use in various types of electronic apparatuses, including digital devices, audio-video appliances, and information communication terminals.

DESCRIPTION OF THE RELATED ART

As illustrated in FIG. 5, a conventional common mode noise filter of this type includes non-magnetic section 1, first coil 2, second coil 3, magnetic sections 4, and metal layers 5. Each of first coil 2 and second coil 3 is formed in a spiral fashion inside non-magnetic section 1. Magnetic sections 4 are formed so as to face each other with an insulating part therebetween. Metal layers 5 are formed in respective magnetic sections 4.

Each of metal layers 5 is formed so as to face first coils 2 and second coils 3. Furthermore, each metal layer 5 is connected to the ground. This common mode noise filter shunts high-frequency common mode noise to the ground through stray capacitance generated between metal layers 5, first coil 2, and second coil 3, thereby attenuating common mode noise in a high-frequency range.

PTL 1 discloses a known example of prior art document information relating to the above conventional invention.

CITATION LIST

Patent Literature

PTL 1: Unexamined Japanese Patent Publication No. 2003-318687

SUMMARY OF THE INVENTION

In the above conventional common mode noise filter, the stray capacitance between metal layers 5, first coil 2, and second coil 3 is difficult to increase. This means that attenuation characteristics of the common mode noise in a low frequency range are difficult to increase. Therefore, there has been a problem that it is difficult to attenuate common mode noise over a wide frequency range.

An object of the present disclosure, which solves the above conventional problem, is to provide a common mode noise filter that can improve attenuation characteristics of common mode noise over a wide frequency range.

A common mode noise filter of a first aspect includes: two magnetic sections, each of which has a layer containing a magnetic material; and a non-magnetic section having a layer containing a non-magnetic material. This common mode noise filter further includes: two coils disposed inside the non-magnetic section; and a metal layer disposed inside at least one of the two magnetic sections, the metal layer being grounded. The non-magnetic section is disposed between the two magnetic sections in a stacking direction. Each of the two coils includes a central section and a conductive wire wound in a plane around the central section. The plane of each of the two coils is disposed along a layer containing the non-magnetic material. The two coils face each other. Each of the magnetic sections has an interface to the non-magnetic section and a surface opposite to the interface in the stacking direction. The metal layer is disposed closer to the surface opposite to the interface than the interface.

The common mode noise filter according to a second aspect has a configuration in which a boundary is present between the non-magnetic section and the magnetic section having the metal layer, in addition to the configuration of the first aspect. Moreover, a relationship $d2/d1 \geq 1$ is satisfied, where $d1$ denotes a distance between the boundary and one of the two coils that is present closer to the boundary, and $d2$ denotes a distance between the boundary and the metal layer.

The common mode noise filter according to a third aspect has a configuration in which relationships $\varepsilon 2 > 2 \times \varepsilon 1$ and $\varepsilon 2/\varepsilon 1 \geq d2/d1$ are satisfied, where $\varepsilon 1$ denotes a relative permittivity of the non-magnetic section, and $\varepsilon 2$ denotes a relative permittivity of the magnetic sections having the metal layer, in addition to the configuration of the second aspect.

The common mode noise filter according to a fourth aspect has a configuration in which the magnetic core section is present inside the coils and does not overlap the metal layer in a top view, the magnetic core section containing a magnetic material, in addition to the configuration of the first to third aspects.

The common mode noise filter of the present disclosure enables enlargement of a portion of the magnetic section which has a high dielectric constant and is disposed between each coil and the metal layer without the need to increase an entire thickness of the magnetic section. This configuration successfully increases stray capacitance between each coil and the metal layer. Consequently, it is possible to increase attenuation characteristics of common mode noise in the low frequency region. Therefore, this common mode noise filter is effective in improving attenuation characteristics of common mode noise over a wide frequency range.

DETAILED DESCRIPTON OF THE PREFERRED EMBODIMENTS

A common mode noise filter according to an exemplary embodiment of the present disclosure will be described below with reference to the drawings.

Figure 1:
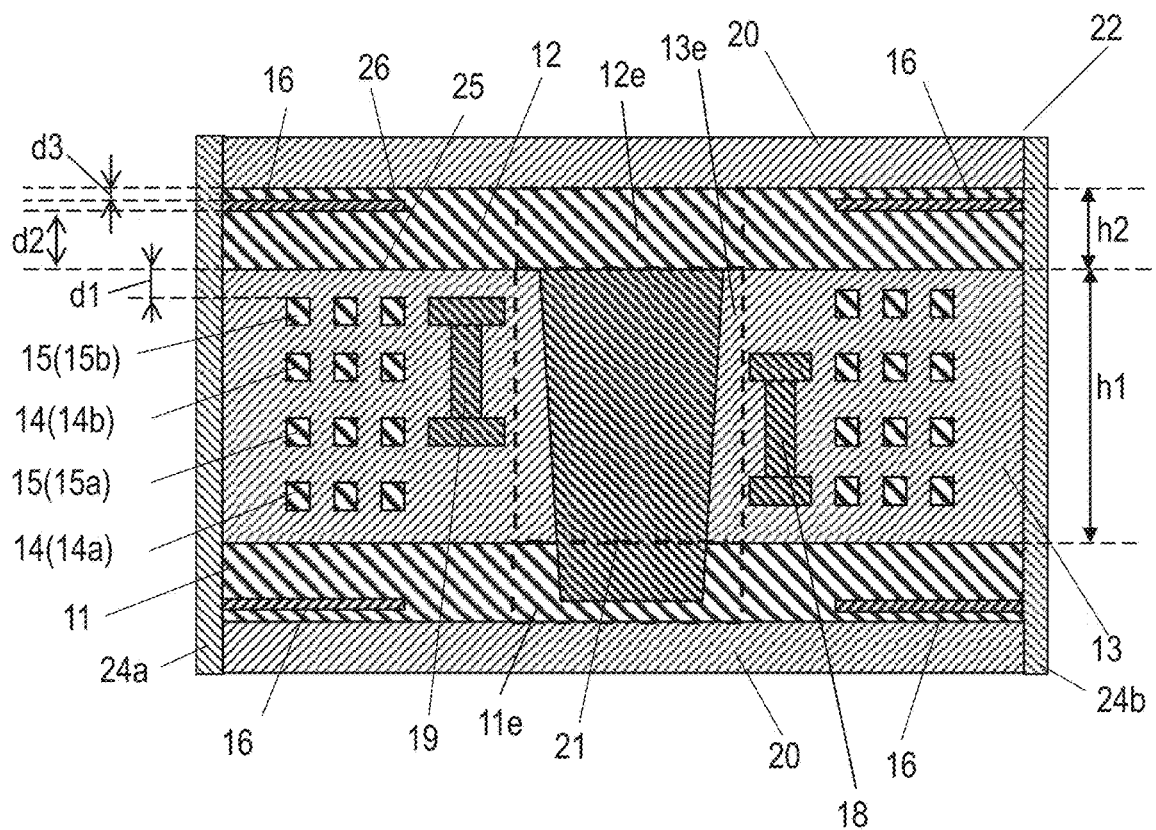
FIG. 1 is a cross-sectional view of a common mode noise filter according to an exemplary embodiment of the present disclosure.
Figure 2:
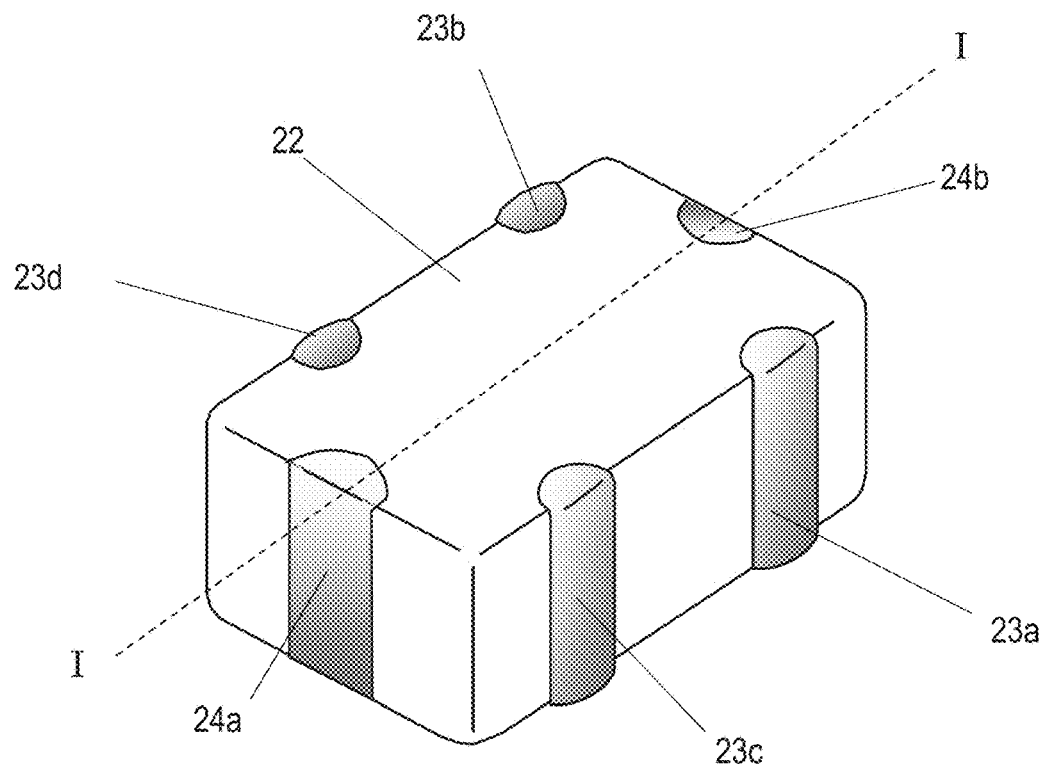
FIG. 2 is a perspective view of the common mode noise filter.
Figure 3:
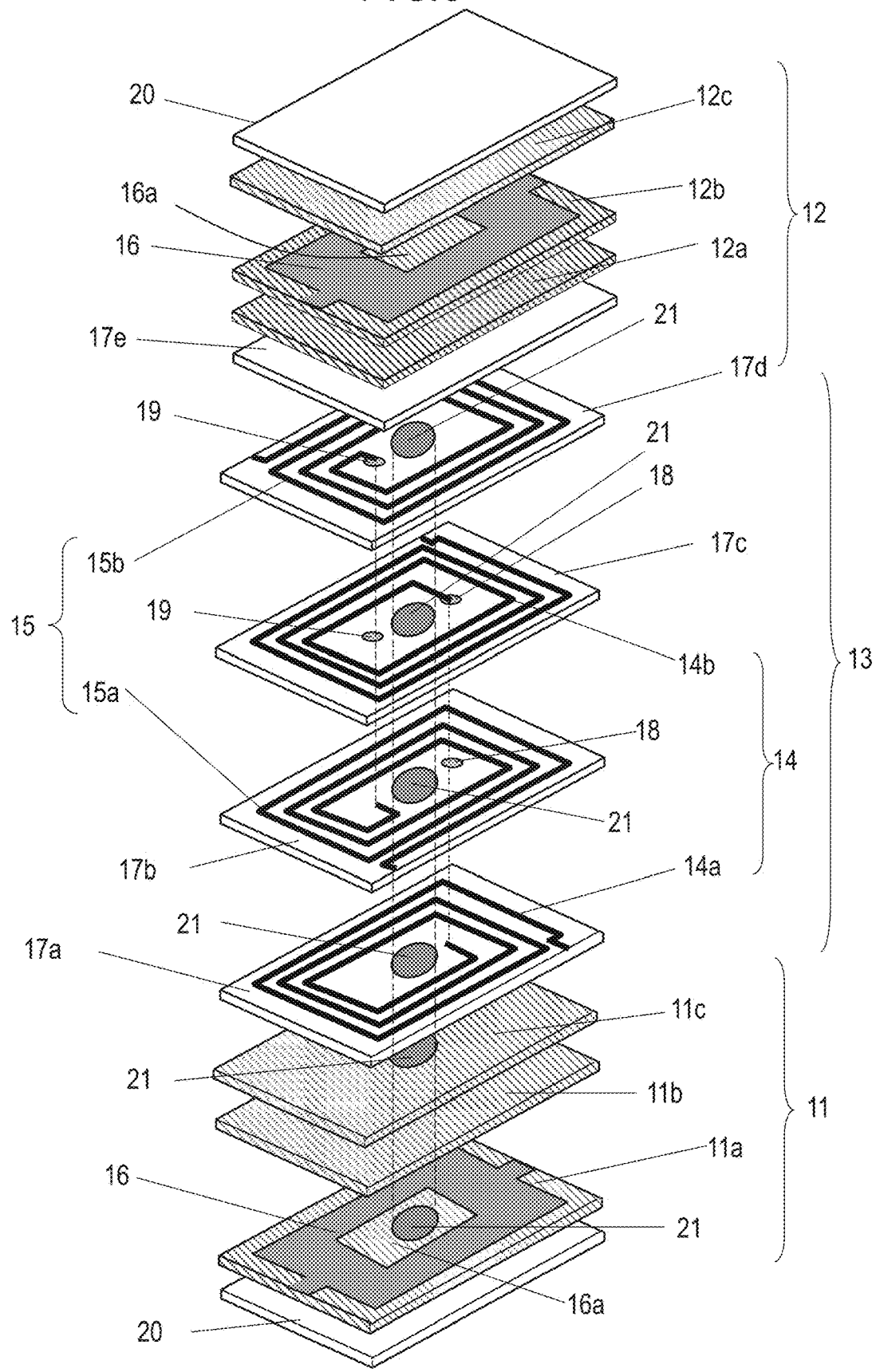
FIG. 3 is an exploded perspective view of the common mode noise filter.

FIG. 1 is a cross-sectional view of the common mode noise filter according to the exemplary embodiment of the present disclosure; FIG. 2 is a perspective view of the common mode noise filter; and FIG. 3 is an exploded perspective view of the common mode noise filter. It should be noted that FIG. 1 corresponds to a cross-sectional view taken along line I-I of FIG. 2.

The common mode noise filter according to the exemplary embodiment of the present disclosure is illustrated in FIGS. 1 to 3. This common mode noise filter includes: first magnetic section 11 made of a magnetic material; second magnetic section 12 made of a magnetic material; and non-magnetic section 13 made of a non-magnetic material. Non-magnetic section 13 is disposed between first magnetic section 11 and second magnetic section 12. Moreover, this common mode noise filter further includes first coil 14, second coil 15, and metal layers 16. First coil 14 and second coil 15 are disposed inside non-magnetic section 13 while facing each other. Metal layers 16 are formed inside first magnetic section 11 and second magnetic section 12 while being connected to the ground. Hereinafter, when non-magnetic section 13 is viewed, upward and downward directions are defined as follows: a side of first magnetic section 11 is defined as the "lower side", and a side of second magnetic section 12 is defined as the "upper side". In this case, a direction from first magnetic section 11 toward second magnetic section 12 corresponds to the upward direction. According to this definition, second magnetic section 12 is disposed "above" (or "on an upper side of") first magnetic section 11.

In the configuration of the above common mode noise filter, first magnetic section 11 is formed by stacking first magnetic layer 11a, second magnetic layer 11b, and third magnetic layer 11c in this order from the bottom. Each of first magnetic layer 11a, second magnetic layer lib, and third magnetic layer 11c is made of a magnetic material, such as Ni—Zn ferrite. In short, first magnetic section 11 has a structure in which many layers are stacked. A direction in which many layers are stacked in order is referred to below as the "stacking direction". A direction orthogonal to this stacking direction and along the surfaces of the layers is referred to as the "in-plane direction".

Second magnetic section 12 is formed by stacking fourth magnetic layer 12a, fifth magnetic layer 12b, and sixth magnetic layer 12c in this order from the bottom. Each of fourth magnetic layer 12a, fifth magnetic layer 12b, and sixth magnetic layer 12c is made of a magnetic material, such as Ni—Zn ferrite. Second magnetic section 12 is positioned above first magnetic section 11.

Non-magnetic section 13 is formed by stacking first non-magnetic layer 17a to fifth non-magnetic layer 17e in this order from the bottom. Each of first non-magnetic layer 17a to fifth non-magnetic layer 17e is made of a non-magnetic material, such as Cu—Zn ferrite or glass ceramic. With non-magnetic section 13 therebetween, second magnetic section 12 is stacked on first magnetic section 11. In this case, thickness h1 of non-magnetic section 13 in the stacking direction is set to 1.0 times or more to 3.0 times or less thickness h2 of first magnetic section 11 or second magnetic section 12.

First coil 14 includes first coil conductor 14a and second coil conductor 14b, each of which is formed by plating or printing a conductive material, such as silver, in a spiral fashion. First coil conductor 14a is connected to second coil conductor 14b through via-electrode 18. First coil conductor 14a is positioned below second coil conductor 14b.

First coil 14 has a planar shape in which each of first coil conductor 14a and second coil conductor 14b is formed in a spiral and planer fashion around the central section.

Second coil 15 includes third coil conductor 15a and fourth coil conductor 15b, each of which is formed by plating or printing a conductive material, such as silver, in a spiral fashion. Third coil conductor 15a is connected to fourth coil conductor 15b through via-electrode 19. Fourth coil conductor 15b is positioned above third coil conductor 15a.

Second coil 15 has a planar shape in which each of third coil conductor 15a and fourth coil conductor 15b is formed in a spiral and planar fashion around the central section.

Centers of first coil conductor 14a, second coil conductor 14b, third coil conductor 15a, and a fourth coil conductor 15b are substantially aligned with one another, thereby forming central section 13e (defined by a broken line in FIG. 1) of the non-magnetic section 13. A region formed by extending central section 13e to second magnetic section 12 in an upward direction corresponds to central section 12e (defined by an alternate long and short dash line in second magnetic section 12 in FIG. 1). Likewise, a region formed by extending central section 13e to first magnetic section 11 in a downward direction corresponds to central section 11e (defined by an alternate long and short dash line in first magnetic section 11 in FIG. 1). Central sections 11e, 12e, and 13e extend, respectively, in first magnetic section 11, second magnetic section 12, and non-magnetic section 13 in the stacking direction. Thus, each of central sections 11e, 12e, and 13e may also be referred to as, respectively, stack-directional central sections 11e, 12e, and 13e.

First coil 14 and second coil 15 are independent of each other.

First coil conductor 14a is formed on first non-magnetic layer 17a. Second coil conductor 14b is formed on third non-magnetic layer 17c. Third coil conductor 15a is formed on second non-magnetic layer 17b. Fourth coil conductor 15b is formed on fourth non-magnetic layer 17d. Fifth non-magnetic layer 17e is formed on fourth coil conductor 15b.

Both of first coil 14 and second coil 15 are embedded in non-magnetic section 13 while being alternately stacked. Furthermore, both first coil 14 and second coil 15 substantially face each other in a top view.

It should be noted that configurations of first coil 14 and second coil 15 are not limited to those illustrated in FIGS. 1 and 3. Alternatively, first coil 14 may be formed between third coil conductor 15a and fourth coil conductor 15b that constitute second coil 15. Furthermore, each of coil conductor 14a positioned at a lowermost part of first coil 14 and coil conductor 15b positioned at an uppermost part of second coil 15 may have any shape other than the spiral shape, such as a linear shape or an L shape.

Metal layers 16, made of Ag, are each formed by printing, plating, or bonding a metal sheet and are provided on upper surfaces of first magnetic layer 11a and fifth magnetic layer 12b.

Metal layers 16 are embedded in first magnetic section 11 and second magnetic section 12. Metal layer 16 embedded in first magnetic section 11 is disposed closer to a lower surface of first magnetic section 11 than an upper surface of first magnetic section 11. Metal layer 16 embedded in second magnetic section 12 is disposed closer to an upper surface of second magnetic section 12 than a lower surface of second magnetic section 12.

Each of metal layers 16 has cutout part 16a in the center and overlaps, in a top view, main portions (from the innermost circumference to the outermost circumference excluding the drawn part) of first coil conductor 14a, second coil conductor 14b, third coil conductor 15a, and fourth coil conductor 15b.

The above configuration shunts high-frequency common-mode noise to the ground through stray capacitance generated between first coil 14, second coil 15, and metal layers 16, thereby successfully attenuating common-mode noise in a high-frequency range.

Formed on the lower surface of first magnetic section 11 and the upper surface of second magnetic section 12 are non-magnetic layers 20, each of which is made of a non-magnetic material. Further formed on outer sides of non-magnetic layers 20 in the stacking direction may be magnetic layers, each made of a magnetic material.

Formed, in a top view, inside the coils (inside the inner circumferences) of first coil conductor 14a, second coil conductor 14b, third coil conductor 15a, and fourth coil conductor 15b are magnetic core sections 21. All of magnetic core sections 21 are disposed in central section 13e.

Magnetic core sections 21 are integrally formed in first non-magnetic layer 17a to fifth non-magnetic layer 17e and first magnetic layer 11a to third magnetic layer 11c. Magnetic core sections 21 help the magnetic fields generated by first coil 14 and second coil 15 to mutually strengthen, thereby enhancing a common mode impedance.

Magnetic core sections 21 are not in contact with any of first coil conductor 14a, second coil conductor 14b, third coil conductor 15a, and fourth coil conductor 15b and are formed so as to be flush with metal layer 16 in first magnetic section 11. In short, magnetic core sections 21 are disposed inside cutout parts 16a in a top view.

Each magnetic core section 21 has a higher density than those of first magnetic section 11 and second magnetic section 12.

By increasing the density of each magnetic core section 21, the mutually strengthening magnetic fields can be further strengthened, and the common mode impedance thereby can be further enhanced.

Each magnetic core section 21 is formed by stacking non-magnetic section 13 on first magnetic section 11 and then making holes with laser, and filling the holes with a magnetic material. In this case, in a top view, each metal layer 16 does not overlap any of magnetic core sections 21 but overlaps cutout parts 16a. A reason for this is to prevent metal layers 16 from being damaged by the laser when magnetic core sections 21 are formed.

Presence of cutout parts 16a helps enhancement of adhesion of first magnetic layer 11a to third magnetic layer 11c and fourth magnetic layer 12a to sixth magnetic layer 12c, thereby suppressing an occurrence of delamination.

Metal layers 16 are formed on both of first magnetic section 11 and second magnetic section 12 as described above; however, metal layer 16 may be formed on one of first magnetic section 11 and second magnetic section 12.

A number of first non-magnetic layer 17a to fifth non-magnetic layer 17e, first magnetic layer 11a to third magnetic layer 11c, and fourth magnetic layer 12a to sixth magnetic layer 12c may be different from a number described above and illustrated in FIG. 3.

The above structure forms stacked body 22. Formed on both side surfaces of stacked body 22 are first external electrode 23a, second external electrode 23b, third external electrode 23c, and fourth external electrode 23d, which are connected, respectively, to lead portions of first coil conductor 14a, second coil conductor 14b, third coil conductor 15a, and fourth coil conductor 15b. Formed on both end surfaces of stacked body 22 are fifth external electrode 24a and sixth external electrode 24b, which are connected to respective metal layers 16. Fifth external electrode 24a and sixth external electrode 24b are connected to the ground.

In the exemplary embodiment of the present disclosure, as described above, portions of first magnetic section 11 and second magnetic section 12, each of which has a high dielectric constant and which are disposed between first coil 14, second coil 15, and metal layers 16, can be enlarged. In this way, the stray capacitance can be increased between first coil 14, second coil 15, and metal layers 16. Consequently, the resonance frequency can be lowered.

The above configuration shunts high-frequency common-mode noise to the ground through the stray capacitance generated between first coil 14, second coil 15, and metal layers 16, thereby successfully attenuating common-mode noise in a high-frequency range. In short, the configuration is effective in improving attenuation characteristics of common mode noise over a wide frequency range from low to high frequencies.

Of metal layers 16, one is simply positioned, in the in-plane direction, apart from central section 11e of first magnetic section 11 in the stacking direction, and the other is simply positioned, in the in-plane direction, apart from central section 12e of second magnetic section 12 in the stacking direction. Therefore, it is possible to achieve a low-profile design without the need to vary the thicknesses of first magnetic section 11 and second magnetic section 12.

Figure 4:
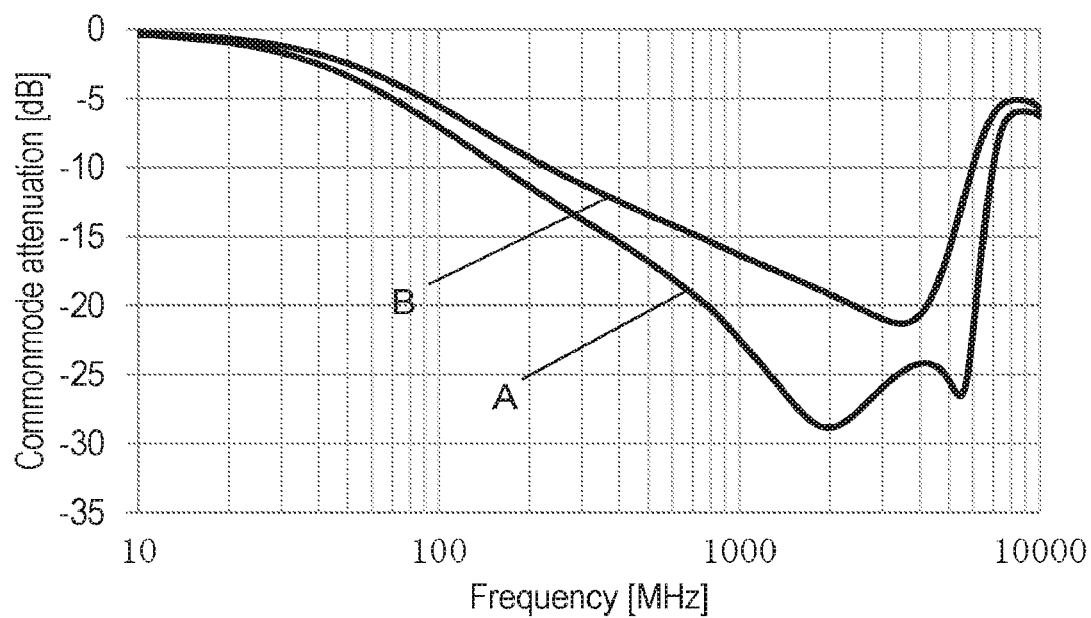
FIG. 4 is a comparison diagram of frequency characteristics of common mode noise filters.
Figure 5:
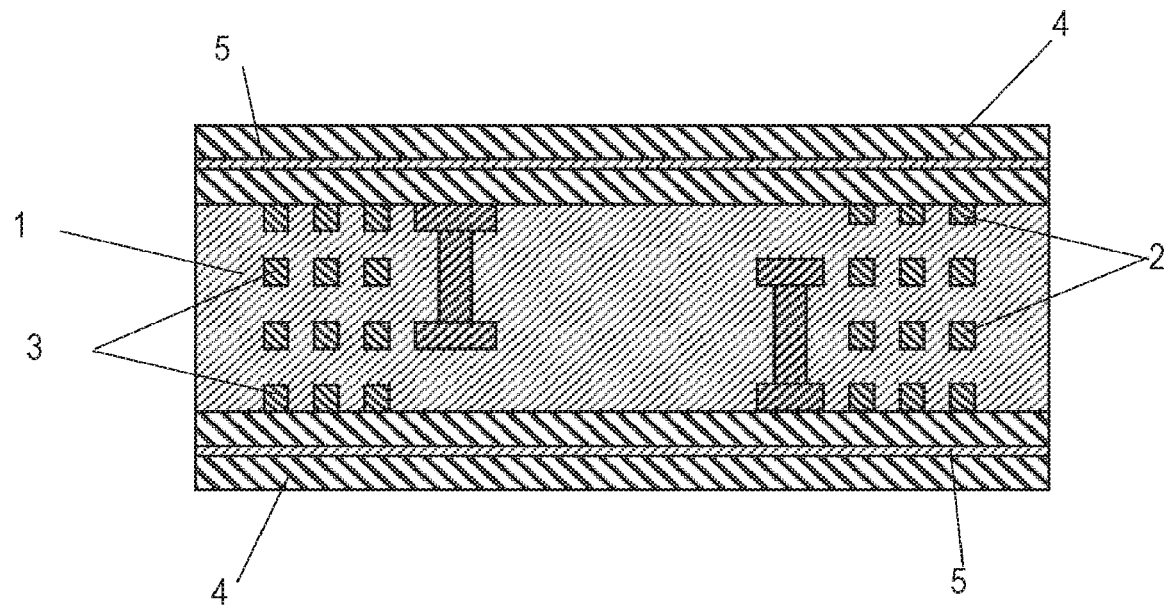
FIG. 5 is a cross-sectional view of a conventional common mode noise filter.

FIG. 4 is a diagram of comparing frequency characteristics (the horizontal axis representing a frequency (in the unit MHz) and the vertical axis representing a common mode attenuation (in the unit dB) for cases A ($d2>d3$) and B ($d2=d3$). In case A, metal layers 16 are positioned closer to the lower surface of first magnetic section 11 than the upper surface of first magnetic section 11 and closer to the upper surface of second magnetic section 12 than the lower surface of second magnetic section 12. In case B, metal layers 16 are formed in middle planes of first magnetic section 11 and second magnetic section 12. Herein, the "middle plane of first magnetic section 11" refers to a plane that is positioned parallel to the upper and lower surfaces of first magnetic section 11 and at the same distance from the upper and lower surfaces of first magnetic section 11. In short, the "middle plane of first magnetic section 11" refers to a plane that satisfies $d2=d3$. Similarly, the "middle plane of second magnetic section 12" refers to a plane that satisfies $d2=d3$.

As can be seen from FIG. 4, A exhibits greater attenuation of common mode noise over a wider frequency range.

The common mode noise filter has a relationship $d2/d1 \geq 1$, where d1 (referred to below as a distance on the metal layer side) denotes a distance from boundary surface 25 between second magnetic section 12 and non-magnetic section 13 (between fifth non-magnetic layer 17a and fourth magnetic layer 12a) to second coil 15 (fourth coil conductor 15b) present closest to boundary surface 25, and d2 denotes a distance from boundary surface 25 to metal layer 16 (referred to below as a distance on the coil side).

Distance d2 on the metal layer side is set to be longer than distance d1 on the coil side. The same relationship is applied to a boundary surface between first magnetic section 11 and non-magnetic section 13. Also, the same relationship is true of the description that will be given below.

The common mode noise filter also satisfies a relationship $d3<d2$, where d3 denotes a distance from boundary surface 26 between second magnetic section 12 and non-magnetic layer 20 to metal layer 16.

The above relationships enable enlargement of portions of first magnetic section 11 and second magnetic section 12, each of which has a high dielectric constant and which are disposed between first coil 14, second coil 15, and metal layers 16. In this way, the stray capacitance can be increased between first coil 14, second coil 15, and metal layers 16.

Total capacitance C between metal layer 16 and fourth coil conductor 15b is equal to a sum of capacitance C1 between boundary surface 25 and fourth coil conductor 15b and capacity C2 between boundary surface 25 and metal layer 16. Therefore, the relationship $C=(C1\times C2)/(C1+C2) = \{(\varepsilon 1/d1)\times(\varepsilon 2/d2)\}/\{(\varepsilon 1/d1)+(\varepsilon 2/d2)\}$ is satisfied. In this case, ε1 denotes a relative permittivity of non-magnetic section 13, and ε2 denotes a relative permittivity of each of first magnetic section 11 and second magnetic section 12.

If $d1=d2=1$ and $\varepsilon1=\varepsilon2$, the relationship $C=\varepsilon1/2$ is satisfied. However, if $d2=2\times d1$, the relationship $C=\varepsilon1\times(2/3)$ is satisfied, and thus total capacitance C increases. Therefore, it is preferable that the relationship $d2\geq d1$ be satisfied. It is, however, preferable that the relationship $d2=2\times d1$ or less be satisfied, in terms of thickness h2 of first magnetic section 11 and second magnetic section 12 and a limitation on a product thickness (lower profile).

Since $\varepsilon1=\varepsilon2$ is impossible, and if $\varepsilon1=2\times\varepsilon2$ and $C=\varepsilon1/2$, total capacitance C does not vary. Therefore, it is preferable that the relationship $\varepsilon1>2\times\varepsilon2$ be satisfied.

Thicknesses, number, and materials of the individual layers are determined as appropriate such that the relationships of the thicknesses and the dielectric constants, as described above, are satisfied.

In order to increase the stray capacitance between first coil 14, second coil 15, and metal layers 16, as described above, distance d2 on the metal layer side is set to be longer than distance d1 on the coil side so that the relationship $d2/d1\geq1$ is satisfied. The dielectric constant is set such that the relationship $\varepsilon2/\varepsilon1>1$ is satisfied. In which case, the relationship $\varepsilon2/\varepsilon1\geq d2/d1$ ($\geq1$) needs to be satisfied.

In order to increase the stray capacitance between first coil 14, second coil 15, and metal layers 16, it is more preferable to strengthen the influence of the dielectric constants rather than the influence of the thicknesses. This is because the strengthening of the influence of the dielectric constants is more advantageous to a lower product profile.

A common mode noise filter according to the present disclosure is effective in improving attenuation characteristics of common mode noise over a wide frequency range. This common mode noise filter is useful, especially as noise countermeasures for various types of electronic apparatuses, including digital devices, audio-video appliances, and information communication terminals.

The invention claimed is:

1. A common mode noise filter comprising:
a first magnetic section and a second magnetic section, the first magnetic section having a plurality of layers containing a first magnetic material, the plurality of layers having a bottom layer, and the second magnetic section having a layer containing the first magnetic material;
a non-magnetic section having a layer containing a non-magnetic material;
two coils disposed inside the non-magnetic section;
a first metal layer disposed on the bottom layer of the first magnetic section and a second metal layer disposed inside the second magnetic section, the first and second metal layers being grounded; and
a magnetic core section containing a second magnetic material, wherein:
the non-magnetic section is disposed between the first and second magnetic sections in a stacking direction of stacking the first and second magnetic sections and the non-magnetic section,
each of the two coils includes a central section and a conductive wire wound in a plane around the central section,
the plane of each of the two coils is disposed along the layer containing the non-magnetic material,
the two coils face each other,
the first magnetic section has a first interface to the non-magnetic section and a first surface opposite to the first interface in the stacking direction and the second magnetic section has a second interface to the non-magnetic section and a second surface opposite to the second interface in the stacking direction,
the first metal layer is disposed closer to the first surface than the first interface,
the magnetic core section is present inside the two coils and does not overlap the first and second metal layers in a top view,
a bottom of the magnetic core section is embedded in and in direct contact with one of the first or second magnetic sections, and a top of the magnetic core section is in direct contact with another of the first or second magnetic sections,
the bottom layer of the first magnetic section is disposed opposed to the non-magnetic section,
the bottom of the magnetic core section is disposed on the bottom layer of the first magnetic section,
the first metal layer surrounds the magnetic core section at the bottom layer of the first magnetic section in the top view, and
the second metal layer surrounds the magnetic core section in the top view.

2. The common mode noise filter according to claim 1, wherein
a relationship $d2/d1\geq1$ is satisfied,
where d1 denotes a distance between the first interface and one of the two coils that is present closer to the first interface, and
d2 denotes a distance between the first interface and the first metal layer.

3. The common mode noise filter according to claim 2, wherein relationships $\varepsilon2>2\times\varepsilon1$ and $\varepsilon2/\varepsilon1\geq d2/d1$ are satisfied,
where $\varepsilon1$ denotes a relative permittivity of the non-magnetic section, and
$\varepsilon2$ denotes a relative permittivity of the first magnetic section.

4. The common mode noise filter according to claim 1, wherein each of the first and second metal layers comprises an opening in which the magnetic core section is located in the top view.

5. The common mode noise filter according to claim 1, wherein each of the first and second metal layers comprises an opening.

6. The common mode noise filter according to claim 1, wherein each of the first and second metal layers overlaps, in a top view, the conductive wire of the two coils excluding a drawn part coupled to an external electrode.

7. The common mode noise filter according to claim 1, wherein the second metal layer is disposed closer to the second surface than the second interface.

8. The common mode noise filter according to claim 1, wherein a density of the second magnetic material is higher than a density of the first magnetic material.

* * * * *